(12) United States Patent
Matsuda

(10) Patent No.: US 12,169,058 B2
(45) Date of Patent: Dec. 17, 2024

(54) LIGHT-EMITTING MODULE AND PLANAR LIGHT SOURCE HAVING THE SAME

(71) Applicant: NICHIA CORPORATION, Anan (JP)

(72) Inventor: Yoshikazu Matsuda, Anan (JP)

(73) Assignee: Nichia Corporation, Anan (JP)

( * ) Notice: Subject to any disclaimer, the term of this patent is extended or adjusted under 35 U.S.C. 154(b) by 449 days.

(21) Appl. No.: 17/546,930

(22) Filed: Dec. 9, 2021

(65) Prior Publication Data

US 2022/0196230 A1 Jun. 23, 2022

(30) Foreign Application Priority Data

Dec. 21, 2020 (JP) ................. 2020-211355

(51) Int. Cl.
| | | |
|---|---|---|
| F21V 23/00 | (2015.01) | |
| F21Y 105/16 | (2016.01) | |
| F21Y 115/10 | (2016.01) | |
| H01L 25/075 | (2006.01) | |
| H01L 27/15 | (2006.01) | |
| H05B 45/30 | (2020.01) | |
| H05B 45/39 | (2020.01) | |
| H05B 45/42 | (2020.01) | |

(52) U.S. Cl.
CPC .......... *F21V 23/004* (2013.01); *H01L 27/156* (2013.01); *H05B 45/30* (2020.01); *H05B 45/42* (2020.01); *F21Y 2105/16* (2016.08); *F21Y 2115/10* (2016.08); *H01L 25/0753* (2013.01); *H05B 45/39* (2020.01)

(58) Field of Classification Search
CPC . F21V 23/004; H01L 27/156; H01L 25/0753; H01L 25/167; H01L 33/507; H01L 33/58; H01L 33/60; H01L 33/62; H05B 45/30; H05B 45/42; H05B 45/39; F21Y 2105/16; F21Y 2115/10
See application file for complete search history.

(56) References Cited

U.S. PATENT DOCUMENTS

| | | |
|---|---|---|
| 2006/0202915 A1 | 9/2006 | Chikugawa |
| 2010/0006867 A1 | 1/2010 | Lee et al. |
| 2010/0066258 A1 | 3/2010 | Yasuda |
| 2011/0037740 A1 | 2/2011 | Yamaguchi |
| 2011/0260633 A1 | 10/2011 | Takeda et al. |
| 2013/0009560 A1 | 1/2013 | Takeda et al. |
| 2013/0194795 A1 | 8/2013 | Onaka et al. |

(Continued)

FOREIGN PATENT DOCUMENTS

| | | |
|---|---|---|
| JP | 2006-253215 A | 9/2006 |
| JP | 2007-221025 A | 8/2007 |

(Continued)

*Primary Examiner* — J. E. Schoenholtz
(74) *Attorney, Agent, or Firm* — Kim & Stewart LLP

(57) ABSTRACT

A light-emitting module includes a first terminal, a second terminal, a first light source, a second light source, and a third light source. The first light source is connected between the first terminal and the second terminal. The second light source and the third light source are connected between the first terminal and the second terminal, in anti-parallel with the first light source. The first, second, and third light sources are aligned in a first direction along a light-emitting surface, with the first light source between the second light source and the third light source.

20 Claims, 9 Drawing Sheets

(56) References Cited

U.S. PATENT DOCUMENTS

| | | | |
|---|---|---|---|
| 2014/0191655 A1 | 7/2014 | Kasakura et al. | |
| 2020/0379165 A1 | 12/2020 | Hayashi | |
| 2020/0381602 A1 | 12/2020 | Yoshinaga et al. | |
| 2022/0124891 A1* | 4/2022 | Delvaux | H05B 45/3725 |

FOREIGN PATENT DOCUMENTS

| | | |
|---|---|---|
| JP | 2008-059786 A | 3/2008 |
| JP | 2008-171984 A | 7/2008 |
| JP | 2010-067990 A | 3/2010 |
| JP | 2011-176300 A | 9/2011 |
| JP | 2012-138428 A | 7/2012 |
| JP | 2012-199539 A | 10/2012 |
| JP | 2013-042099 A | 2/2013 |
| JP | 2014-143307 A | 8/2014 |
| JP | 2019-140347 A | 8/2019 |
| JP | 2020-198293 A | 12/2020 |
| JP | 2020-198421 A | 12/2020 |
| WO | 2010/070885 A1 | 6/2010 |
| WO | 2011/093395 A1 | 8/2011 |
| WO | 2012/033180 A1 | 3/2012 |
| WO | 2012/086790 A1 | 6/2012 |

* cited by examiner

LIGHT-EMITTING MODULE AND PLANAR LIGHT SOURCE HAVING THE SAME

CROSS-REFERENCE TO RELATED APPLICATIONS

This application claims priority to Japanese Patent Application No. 2020-211355, filed on Dec. 21, 2020, the disclosure of which is hereby incorporated by reference in its entirety.

BACKGROUND

A backlight module, a lighting module, and the like utilize a planar light source. There is a planar light source in which light-emitting elements such as small LEDs or the like are used as light sources; and the light sources are arranged in a two-dimensional planar configuration.

In such a planar light source, there are cases where the luminance at a light source is amplified due to lights from the adjacent light sources; and the amplification of the luminance is different among light sources according to the distances and/or number of adjacent light sources. Even when the light sources in the same planar light source emit light of the same luminance, the luminance of an entire light-emitting surface of the planar light source may not become uniform.

SUMMARY

Embodiments provide a light-emitting module and a planar light source with improved luminance uniformity.

A light-emitting module according to an embodiment of the present disclosure includes a first terminal, a second terminal, a first light source, a second light source, and a third light source. The first light source is connected between the first terminal and the second terminal. The second light source and the third light source are connected between the first terminal and the second terminal, in anti-parallel with the first light source. The first, second, and third light sources are aligned in a first direction along a light-emitting surface, with the first light source between the second light source and the third light source.

A planar light source according to an embodiment of the present disclosure includes a wiring substrate and a matrix of the light-emitting modules. The wiring substrate includes a first connector and a second connector. The matrix of light-emitting modules is disposed on the wiring substrate. Each of the light-emitting modules includes the first terminal, a second terminal, a first light source, and a second light source. The first terminal is electrically connected to the first connector. The second terminal is electrically connected to the second connector. The first light source is connected between the first terminal and the second terminal. The second light source and a third light source are connected between the first terminal and the second terminal, in anti-parallel with the first light source. The first, second, third light sources are aligned in a first direction along a light-emitting surface, with the first light source between the second light source and the third light source.

DETAILED DESCRIPTION

Figure 1:
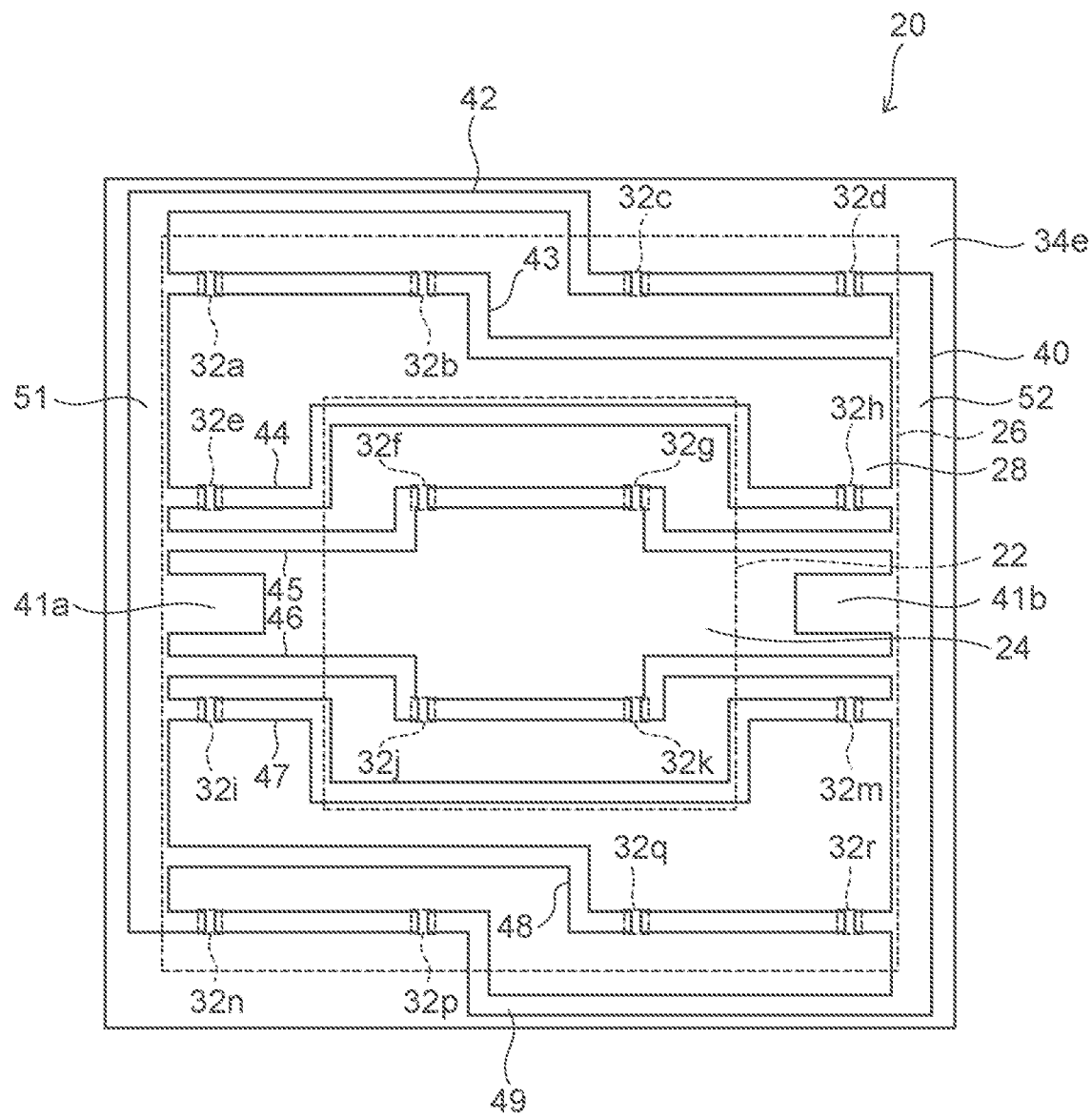
FIG. 1 illustrates a schematic plan view of a light-emitting module according to a first embodiment.

Exemplary embodiments will now be described with reference to the drawings.

The drawings are schematic or conceptual; and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions.

In the specification of the application and the drawings, components similar to those described in regard to a drawing thereinabove are marked with like reference numerals, and a detailed description is omitted as appropriate.

First Embodiment

FIG. 1 illustrates a schematic plan view of a light-emitting module according to a first embodiment.

FIG. 1 schematically illustrates a layout of a wiring pattern of a wiring layer 40 of a light-emitting module 20 according to the present embodiment; and the wiring layer 40 includes multiple wiring patterns. The wiring layer 40 is located on a wiring mounting surface 34e of the light-emitting module 20.

In the specification, a wiring pattern refers to a film-shaped or plate-shaped conductive body formed in any applicable shape.

Three-dimensional coordinates may be used in the following description. The wiring mounting surface 34e is in a plane substantially parallel to an XY plane. Accordingly, the wiring layer 40 is in a plane that is substantially parallel to the XY plane. The three-dimensional coordinates are a right-handed coordinate system in which a Z-axis is toward the front direction of the page surface. Multiple light sources 32a to 32r are located in wiring patterns 42 to 49 of the wiring layer 40; and a light emission direction of the multiple light sources 32a to 32r is a direction toward the negative direction of the Z-axis.

As shown in FIG. 1, the light-emitting module 20 includes the multiple light sources 32a to 32r and terminals (a first terminal and a second terminal) 41a and 41b. In the example, four of the light sources 32a to 32r are arranged in a row along an X-axis direction; and four such rows are arranged along a Y-axis direction. Thus, the sixteen light sources 32a to 32r are arranged in a matrix form.

The light sources 32a to 32r include light-emitting elements. The light sources 32a to 32r each itself may be referred to as a light-emitting element. The light-emitting element includes a semiconductor stacked body, and positive and negative electrodes electrically connected to the semiconductor stacked body. The semiconductor stacked body includes, for example, a support substrate of sapphire, gallium nitride, etc., an n-type semiconductor layer and a p-type semiconductor layer located on the support substrate, a light-emitting layer sandwiched between the n-type semiconductor layer and the p-type semiconductor layer, and an n-side electrode and a p-side electrode electrically connected to the n-type semiconductor layer and the p-type semiconductor layer, respectively. The semiconductor stacked body may be formed without the support substrate. The light-emitting layer has a structure such as a double heterostructure, a single quantum well structure (SQW), a multi-quantum well structure (MQW), etc. The light-emitting layer is configured to emit visible light or ultraviolet light. The light-emitting layer is configured to emit light of a color from blue to red as the visible light. For example, $In_xAl_yGa_{1-x-y}N$ ($0 \leq x$, $0 \leq y$, and $x+y \leq 1$) can be included in the light-emitting layer. When the semiconductor stacked body includes multiple light-emitting layers, light-emitting layers of different light emission colors may be included, or light-emitting layers of the same light emission color may be included. The same light emission color refers to a case where wavelengths of light emission colors are within a certain range that can be considered to be the same light emission color in use; and for example, there may be a wavelength difference of about several nano meters in the dominant wavelengths thereof. The combination of light emission colors can be selected as appropriate.

In the light-emitting module 20 described below, the light sources 32a to 32r have substantially the same characteristics. The same characteristics mean that when the same current flows in each light-emitting element, each light-emitting element has the same forward voltage drop; and each light source emits light of the same luminance. This means that when series circuits of the same number of light sources are connected in parallel, and a current is caused to flow in the parallel circuit, substantially the same current flows in each light-emitting element; and each light source emits light of substantially the same luminance.

The reference numerals of the light sources are labeled as 32a to 32r when differentiating the light sources from each other, and are labeled as 32 when the light sources are not differentiated.

The light sources 32a to 32r are electrically connected to the terminals 41a and 41b by the wiring patterns 42 to 49 and wiring patterns 51 and 52. The wiring patterns 42 to 49 include multiple interconnects that electrically connect the light sources arranged in the X-axis direction, and extend substantially along the X-axis direction. The wiring patterns 51 and 52 are interconnects that respectively electrically connect the two ends of each of the wiring patterns 42 to 49, and extend substantially along the Y-axis. The terminal 41a is connected to the wiring pattern 51; and the terminal 41b is connected to the wiring pattern 52.

The terminals 41a and 41b and the wiring patterns 42 to 49, 51, and 52 are components included in the wiring layer 40, and are formed of conductors of the same conductive material. The terminals 41a and 41b and the wiring patterns 42 to 49, 51, and 52 have substantially the same thickness. The resistance values of the interconnects included in the wiring patterns 42 to 49 can be different depending on the lengths and widths of the conductors. The width of the conductor is the length in the XY plane along a direction orthogonal to the direction in which the current flows.

The light-emitting module 20 shown in FIG. 1 includes boundaries 22 and 26. The light sources 32f, 32g, 32j, and 32k are located in a first region 24 that is surrounded with the boundary 22. The boundary 26 surrounds the outer side of the first region 24; and the light sources 32a, 32b, 32c, 32d, 32e, 32h, 32i, 32m, 32n, 32p, 32q, and 32r are located in a second region 28 between the boundary 26 and the boundary 22.

The boundaries 22 and 26 are virtual lines for discriminating the first region 24 in which the light sources 32f, 32g, 32j, and 32k are located and the second region 28 in which the light sources 32a, 32b, 32c, 32d, 32e, 32h, 32i, 32m, 32n, 32p, 32q, and 32r are located. The first region 24 and the second region 28 may be rectangular such as the broken lines in FIGS. 1-3, or may be circular, polygonal such as triangular, etc. The second region 28 is a region at the periphery of the first region 24; in the example, the second region 28 continuously surrounds the first region 24. It is sufficient for the second region 28 to be positioned at the periphery of the first region 24; and the second region 28 may be subdivided into multiple subregions that are positioned at the periphery of the first region 24. For example, when six light sources are arranged in a 2×3 matrix form, the second region 28 may be subdivided into two subregions that are located at the periphery of the first region 24.

Whether the region is the first region 24 or the second region 28 is discriminated for each light source by the number of light sources located at most proximate positions when projected onto the XY plane. As described below, when projected onto the XY plane, the number of light sources located at most proximate positions for each light source in the first region 24 is more than the number of light sources located at most proximate positions for each light source in the second region 28.

Each of the light sources 32f, 32g, 32j, and 32k located in the first region 24 is located between at least two light sources among the light sources 32a, 32b, 32c, 32d, 32e, 32h, 32i, 32m, 32n, 32p, 32q, and 32r located in the second region 28 when projected onto the XY plane. Also, when projected onto the XY plane, each light source in the first region 24 is located between two light sources among the light sources in the second region 28 having shorter distances to the light source of the first region 24.

According to the embodiment, each light source 32 is determined to belong to either the first region 24 or the second region 28 by determining the distance between two light sources as follows.

As in FIG. 3 described below, the spacing in the X-axis direction of the light sources is a distance P1; and the spacing in the Y-axis direction of the light sources is a distance P2. In the example, the distance P1 is substantially equal to the distance P2. For example, as to the light source 32f in the first region 24, the positions of the light sources 32e and 32g are away from each other in the X-axis direction by the distance P1; and the positions of the light sources 32b and 32j are away from each other in the Y-axis direction by the distance P2. Accordingly, the light sources 32e, 32g, 32b, and 32*j* are located at most proximate positions of the light source 32*f*. The number of light sources located at most proximate positions is similarly designated for the light sources 32*g*, 32*j*, and 32*k* in the first region 24 as well; and the number of light sources located at most proximate positions is 4 in each case.

As to the light source 32*a* in the second region 28, the light sources 32*b* and 32*e* are located at most proximate positions; and as to the light source 32*d*, the light sources 32*c* and 32*h* are located at most proximate positions. The number of light sources located at most proximate positions is similarly designated for the light sources 32*n* and 32*p* as well; and the number of light sources located at most proximate positions is 2. As to the light sources 32*b*, 32*c*, 32*e*, 32*h*, 32*i*, 32*m*, 32*p*, and 32*q* in the second region 28, the number of light sources located at most proximate positions is 3. Accordingly, in the example, two or three light sources are located at most proximate positions for each light source in the second region 28.

The relationship between each light source in the first region 24 and two light sources in the second region 28 is determined as follows.

As to the light source 32*f* in the first region 24, the light source 32*e* in the second region 28 is located at a most proximate position to the light source 32*f* in the X-axis direction. In the Y-axis direction, the light source 32*b* in the second region 28 is located at a most proximate position to the light source 32*f*. Accordingly, the light source (first light source) 32*f* in the first region 24 is located between the light source (second light source) 32*b* and the light source (third light source) 32*e* in the second region 28. Similarly, the light source 32*g* in the first region 24 is located between the light source 32*h* and the light source 32*c* in the second region 28. The light source 32*j* in the first region 24 is located between the light source 32*i* and the light source 32*p* in the second region 28. The light source 32*k* in the first region 24 is located between the light source 32*m* and the light source 32*q* in the second region 28.

Figure 2:
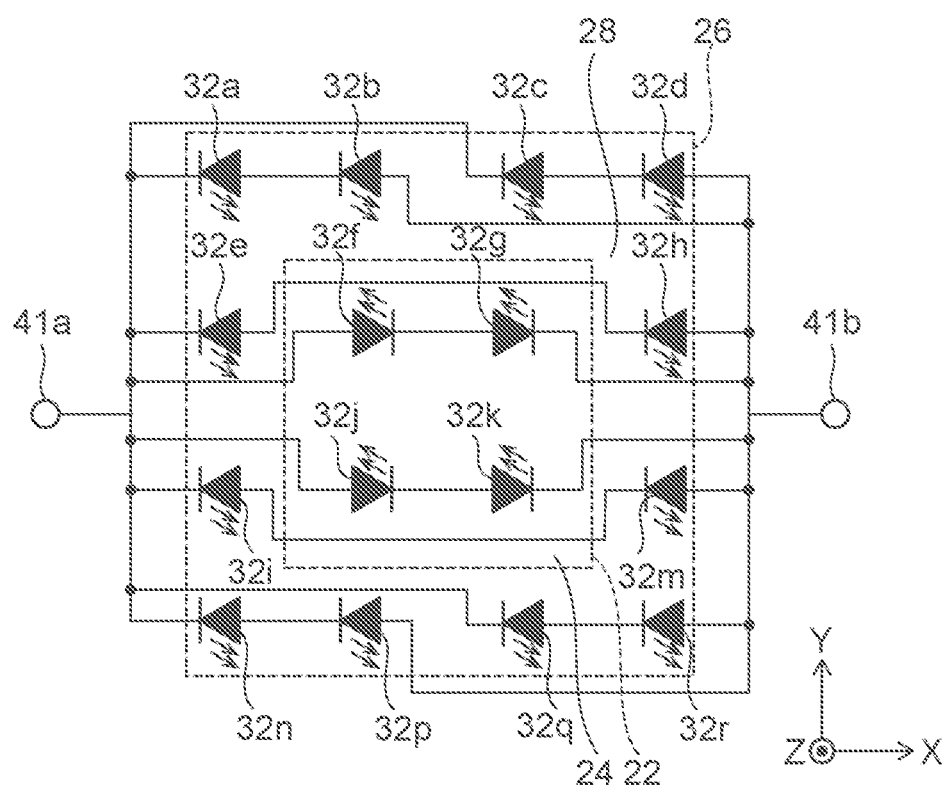
FIG. 2 is a schematic circuit diagram illustrating the light-emitting module according to the first embodiment.

FIG. 2 is a schematic circuit diagram illustrating the light-emitting module according to the first embodiment.

In FIG. 2, the light sources are illustrated using circuit diagram symbols of the light-emitting elements to show the directions of the currents.

In the light-emitting module 20 shown in FIG. 2, eight series circuits are connected in parallel; and each series circuit includes two light sources connected in series. Each of the eight parallel circuits is connected between the terminals 41*a* and 41*b*. Each pair of the light sources 32*a* and 32*b*, the light sources 32*c* and 32*d*, the light sources 32*e* and 32*h*, the light sources 32*f* and 32*g*, the light sources 32*i* and 32*m*, the light sources 32*j* and 32*k*, the light sources 32*n* and 32*p*, and the light sources 32*q* and 32*r* is connected in series.

Referring to FIG. 1, a series circuit of the light sources 32*c* and 32*d* is configured by the wiring pattern 42; and a series circuit of the light sources 32*a* and 32*b* is configured by the wiring pattern 43. The light sources 32*a* to 32*d* are arranged in a substantially straight line along the X-axis direction.

A series circuit of the light sources 32*e* and 32*h* is configured by the wiring pattern 44; and a series circuit of the light sources 32*f* and 32*g* is configured by the wiring pattern 45. The light sources 32*e* to 32*h* are arranged in a substantially straight line along the X-axis direction.

A series circuit of the light sources 32*j* and 32*k* is configured by the wiring pattern 46; and a series circuit of the light sources 32*i* and 32*m* is configured by the wiring pattern 47. The light sources 32*i* to 32*m* are arranged in a substantially straight line along the X-axis direction.

A series circuit of the light sources 32*q* and 32*r* is configured by the wiring pattern 48; and a series circuit of the light sources 32*n* and 32*p* is configured by the wiring pattern 49. The light sources 32*n* to 32*r* are arranged in a substantially straight line along the X-axis direction.

The eight series circuits are connected in parallel between the terminals 41*a* and 41*b* by the wiring patterns 51 and 52.

The light sources 32*f*, 32*g*, 32*j*, and 32*k* are located in the first region 24. The other light sources 32*a*, 32*b*, 32*c*, 32*d*, 32*e*, 32*h*, 32*i*, 32*m*, 32*n*, 32*p*, 32*q*, and 32*r* are located in the second region 28. That is, the series circuit of the light sources 32*f* and 32*g* and the series circuit of the light sources 32*j* and 32*k* pass the first region 24; and the series circuits of the other light sources pass the second region 28.

The light sources 32*f*, 32*g*, 32*j*, and 32*k* that are located in the first region 24 emit light due to a current that flows when the potential of the terminal 41*a* is greater than the potential of the terminal 41*b*. The light sources 32*a*, 32*b*, 32*c*, 32*d*, 32*e*, 32*h*, 32*i*, 32*m*, 32*n*, 32*p*, 32*q*, and 32*r* that are located in the second region 28 emit light due to a current that flows when the potential of the terminal 41*b* is greater than the potential of the terminal 41*a*. The light sources in the first region 24 and the light sources in the second region 28 are alternately lit according to the polarity of the drive power source connected between the terminals 41*a* and 41*b* without simultaneously emitting light. Switching is performed so that the light sources in the first region 24 and the light sources in the second region 28 are alternately lit at a sufficiently high frequency so that flickering is not visible. Here, a sufficiently high frequency refers to being less than the temporal resolution of an eye of a human, i.e., not less than 20 Hz, and more favorably not less than 50 Hz.

The light sources in the first region 24 and the light sources in the second region 28 are alternately lit so that uneven luminance of the entire light-emitting module 20 is reduced. In the example, the luminance when the light sources in the first region 24 emit light is set to be less than the luminance when the light sources in the second region 28 emit light. The uneven luminance of the entire light-emitting surface of the light-emitting module 20 is reduced by such a setting. The luminance of the light source 32 may be controlled by controlling the value of a current flowing in the light source 32 without changing the ratio of a time period that the current is caused to flow and a time period that the current is blocked in the light source 32, or may be controlled by setting the current flowing in the light source to be constant and adjusting the ratio of the time period that the current is caused to flow and the time period that the current is blocked in the light source 32.

Figure 3:
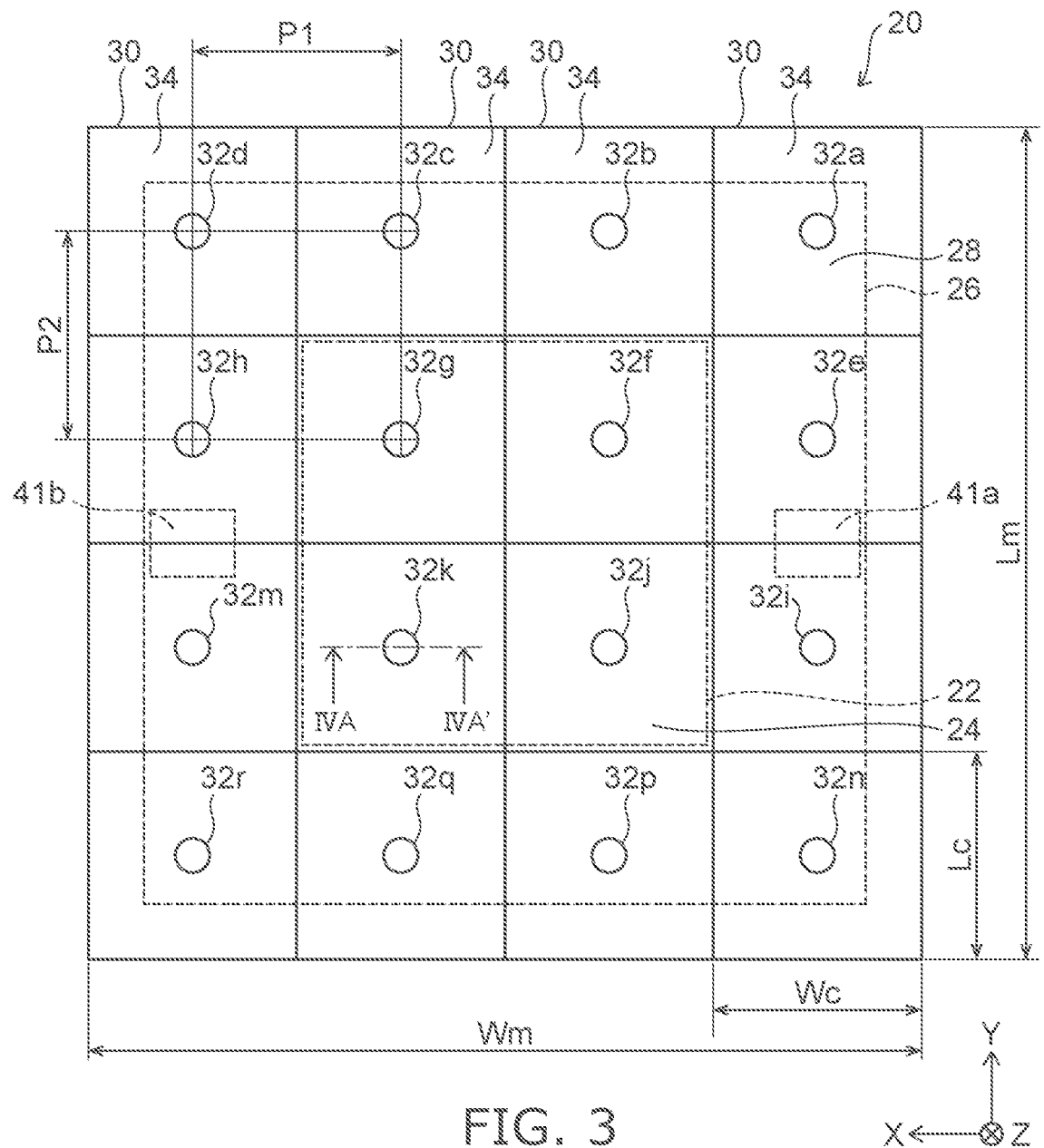
FIG. 3 illustrates a schematic plan view of the light-emitting module according to the first embodiment.

FIG. 3 illustrates a schematic plan view of the light-emitting module according to the first embodiment.

FIG. 3 illustrates a plan view viewed from the light-emitting surface side of the light sources.

As shown in FIG. 3, the light-emitting module 20 includes multiple cells 30. The cells 30 have the same shape. Each cell 30 has a length Wc in the X-axis direction and a length Lc in the Y-axis direction. Four rows of four cells 30 arranged along the X-axis direction are arranged along the Y-axis direction. That is, in the light-emitting module 20, sixteen cells 30 are arranged in a 4×4 matrix form. The light-emitting module 20 has a length Wm in the X-axis direction and a length Lm in the Y-axis direction. Wm is equal to 4×Wc; and Lm is equal to 4×Lm.

By configuring the shapes of the cells 30 to be the same, the degree of freedom of designing the shape and/or dimensions of the light-emitting module 20 due to the combination of the cells 30 can be increased, and the efficiency of designing and manufacturing the light-emitting module 20 can be increased.

The cell 30 includes the light source 32 and a light guide member 34. The shape of the cell 30 when projected onto the XY plane is substantially the same as the shape of the light guide member 34 when projected onto the XY plane. The light source 32 is located at substantially the center of the light guide member 34. The light guide member 34 guides the light emitted by the light source 32 located at substantially the central portion toward the negative direction of the Z-axis. That is, the front surface of the light guide member 34 in FIG. 3 is the light-emitting surface of the light-emitting module 20.

The light guide member 34 can include, for example, a light guide plate or a light guide sheet of a thermoplastic resin such as acrylic, polycarbonate, cyclic polyolefin, polyethylene terephthalate, polyester, or the like, a thermosetting resin such as epoxy, silicone, or the like, glass, etc. Alternatively, an air layer may be used as the light guide member 34.

In the light-emitting module 20 in FIG. 3, the distance between the light sources adjacent to each other in the X-axis direction is P1; and the distance between the light sources adjacent to each other in the Y-axis direction is P2. The shapes of the cells 30 are substantially the same; therefore, P1 is substantially equal to Wc; and P2 is substantially equal to Lc. Also, in the example, We is substantially equal to Lc; and the cell 30 is substantially square when projected onto the XY plane.

Although the light-emitting module 20 has a 4×4 two-dimensional cell arrangement in the example, the arrangement of the cells 30 is not limited thereto, and may be 2×8, etc. Also, the number of cells included in the light-emitting module 20 is not limited to sixteen and can be any number.

Although the light sources 32 of the light-emitting module 20 are arranged two in series and eight in parallel in the description above, the arrangement is not limited thereto and may be, for example, sixteen light sources connected in parallel.

Figure 4A:
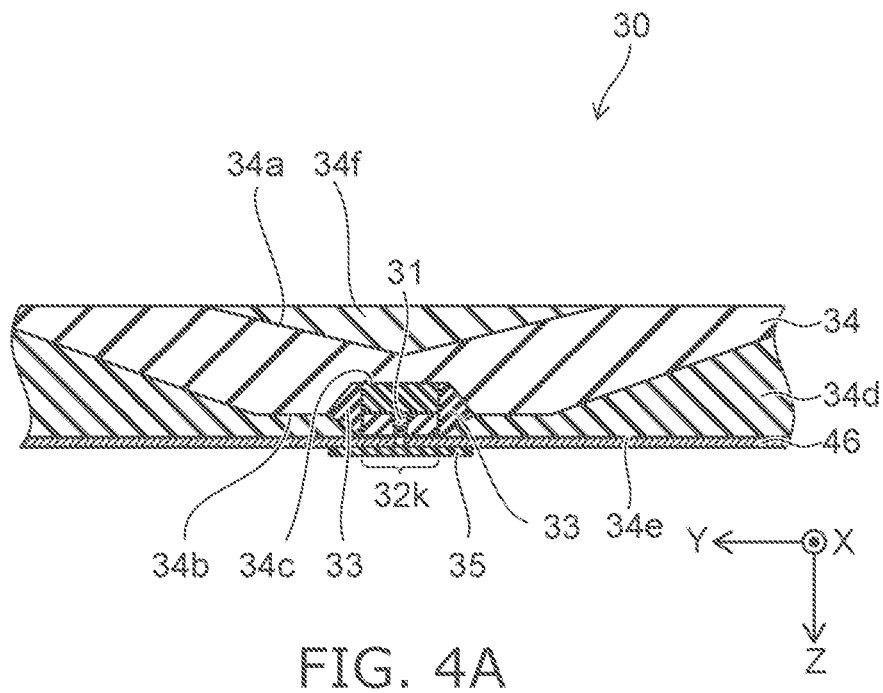
FIG. 4A illustrates a schematic auxiliary cross-sectional view of a portion of the light-emitting module along line IVA-IVA' in FIG. 3.

FIG. 4A illustrates a schematic auxiliary cross-sectional view of a portion of the light-emitting module along line IVA-IVA' in FIG. 3.

As shown in FIG. 4A, the light guide member 34 includes a first surface 34a that is the light-emitting surface of the light guide member 34 at the negative-direction side of the Z-axis. The light guide member 34 includes a second surface 34b that is opposite to the first surface 34a. The light guide member 34 has a recess 34c at the second surface 34b.

The light source 32 (32k in FIG. 4A) is inserted into the recess 34c and is fixed to the light guide member 34 by an insulative fixing member 33.

An encapsulant 34d is provided at the second surface 34b; and the electrodes of the light source 32 are not covered with the encapsulant 34d. In the example, the encapsulant 34d includes a wiring mounting surface 34e that is opposite to the surface of the encapsulant 34d coupled to the second surface 34b of the light guide member 34. The encapsulant 34d is reflective to the light emitted by the light source 32 and is formed of, for example, a silicone resin, a phenol resin, an epoxy resin, or an acrylic resin that includes a light-diffusing agent made of particles of $TiO_2$, $SiO_2$, $Al_2O_3$, ZnO, glass, etc. The encapsulant 34d can electrically isolate the light sources 32 from each other, electrically isolate the light source 32 from other conductive members, and guide the light emitted from the light source 32 toward the light guide member 34 by reflecting the light.

The wiring layer 40 (see FIG. 1) is disposed on the wiring mounting surface 34e; and the wiring pattern 46 of the wiring layer 40 is shown in FIG. 4A. The two electrodes of the light source 32 are electrically connected to the wiring pattern 46.

When the size of the light source 32 (32k in FIG. 4A) is small, the distance between the electrodes is short; and the distance between the wiring patterns in the wiring layer also is short. In the example, an insulating resin 35 is provided at a position corresponding to the positions of the electrodes of the light source 32 on the wiring pattern 46 to prevent the electrodes from being exposed to the outside. The insulating resin 35 is, for example, an acrylic resin, an epoxy resin, a resist, etc.

It is favorable to provide a circular-conical, truncated-circular-conical, polygonal-pyramid, or truncated-polygonal-pyramid recess in the first surface 34a of the light guide member 34 and to provide a light-modulating member 34f in the recess. The light-modulating member 34f is formed of a light-reflective material. By providing the light-modulating member 34f directly above the light source 32, the luminance of the region directly above the light source 32 is less likely to be greater than the luminance of the other regions; and the light that is emitted by the light source 32 can be spread to the entire light guide member 34.

Figure 4B:
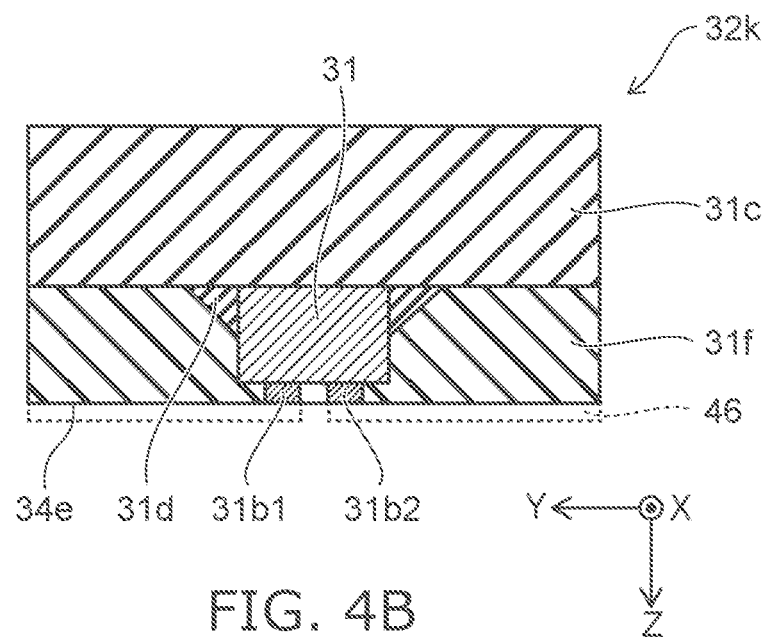
FIG. 4B illustrates an enlarged schematic view a light source depicted in FIG. 4A.

FIG. 4B illustrates an enlarged schematic view of a portion of the light source 32k in FIG. 4A.

As shown in FIG. 4B, the light source 32k includes a light-emitting element 31, electrodes 31b1 and 31b2 electrically connected to the positive and negative electrodes of the light-emitting element, respectively, and a fluorescent layer 31c. In the light-emitting element 31, a surface on which the fluorescent layer 31c is located is a major light-emitting surface. The light-emitting element 31 includes the electrodes 31b1 and 31b2 at a surface opposite to the surface on which the fluorescent layer 31c is located. The electrodes 31b1 and 31b2 are an anode electrode and a cathode electrode.

The fluorescent layer 31c is coupled to the light-emitting element 31 using an insulative bonding member 31d. The bonding member 31d is formed of, for example, a light-transmitting resin. A reflecting member 31f covers the light-emitting element 31 and the bonding member 31d. The reflecting member 31f is an insulative member and is formed of, for example, a silicone resin, a phenol resin, an epoxy resin, or an acrylic resin that includes a light-diffusing agent made of particles of $TiO_2$, $SiO_2$, $Al_2O_3$, ZnO, glass, etc.

As shown in FIG. 4B as well, the electrodes 31b1 and 31b2 of the light source 32k are not covered with the reflecting member 31f. As shown in FIG. 4A, the electrodes 31b1 and 31b2 are not covered with the encapsulant 34d; and the surface at which the electrodes 31b1 and 31b2 are exposed is the wiring mounting surface 34e. The wiring layer 40 that includes the wiring pattern 46 shown by the broken lines is disposed on the wiring mounting surface 34e. The other light sources 32 also have similar configurations.

By such a configuration of the cell 30 of the light-emitting module 20 according to the present embodiment, the light emitted by the light source 32k is spread to the entire light guide member 34; and the uneven luminance is reduced over the entire cell 30. The light guide member 34 is one member that changes light distribution in the cell 30 and reduces the uneven luminance of the entire cell 30. The encapsulant 34d reduces leakage of the light to the adjacent cells 30.

The cells included in the light-emitting module 20 are not limited to the example described above and can have other configurations.

Figure 5A:
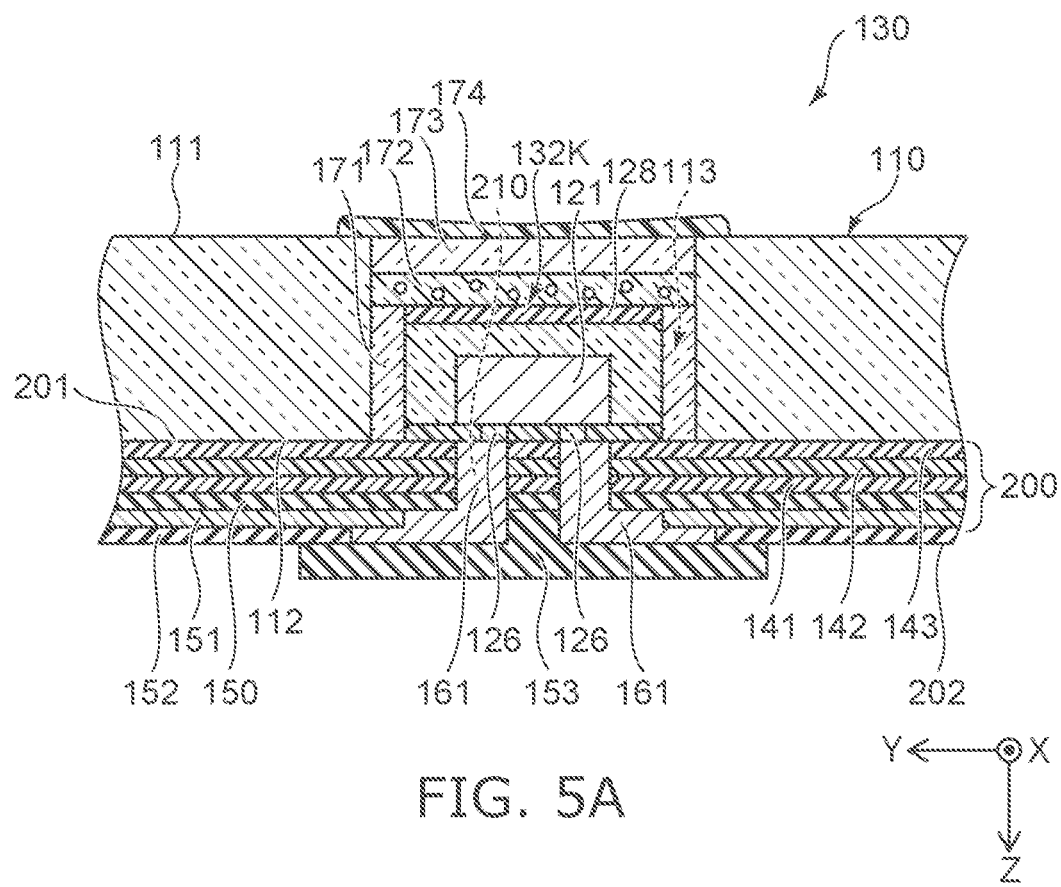
FIG. 5A illustrates a schematic cross-sectional view of a portion of a light-emitting module according to a modification of the first embodiment.

FIG. 5A illustrates a schematic cross-sectional view of a portion of a light-emitting module according to a modification of the first embodiment.

Figure 5B:
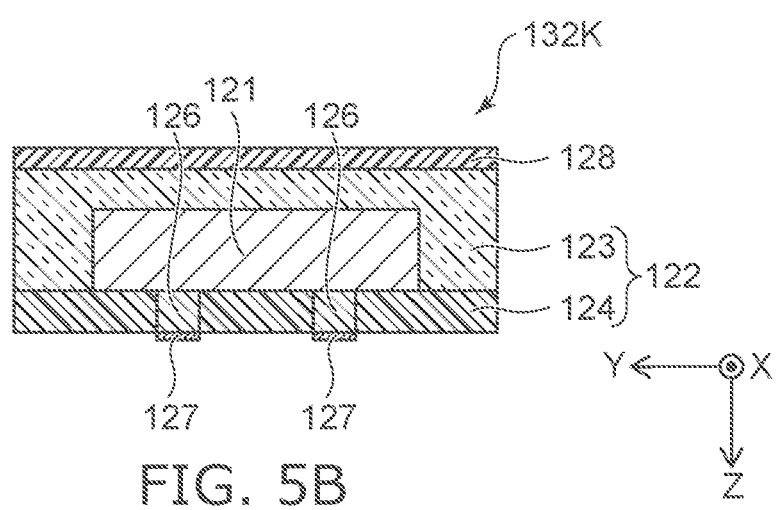
FIG. 5B illustrates an enlarged view of a light source included in a portion of a cell depicted in FIG. 5A.

FIG. 5B illustrates an enlarged view of a light source 132K included in a portion of a cell 130 depicted in FIG. 5A.

The cell 130 corresponds to the cell 30 of FIG. 4A described above; and the light source 132K corresponds to the light source 32k of FIG. 4B. Similarly to the other light sources 32 having the same configuration as the light source 32k in the example described above, the following light source 132K has the same configuration as the other light sources.

As shown in FIG. 5A, the light-emitting module according to the modification includes the cell 130. The cell 130 includes the light source 132K and a light guide member 110.

The light guide member 110 includes a first surface 111 and a second surface 112. The first surface 111 is the light-emitting surface of the cell 130. The second surface 112 is a surface of the light guide member 110 opposite to the first surface 111. The light guide member 110 includes a through-hole 113 in which the light source 132K is located. The through-hole 113 extends through the light guide member 110 between the first surface 111 and the second surface 112.

The cell 130 includes a support member 200. The support member 200 includes an upper surface 201 and a lower surface 202. The lower surface 202 of the support member 200 is a surface opposite to the upper surface 201. The light guide member 110 is located on the support member 200 with the second surface 112 facing the upper surface 201. The light source 132K is located in the through-hole 113 and is located on the support member 200.

The cell 130 can further include a first light-transmitting member 171, a wavelength conversion member 172, a second light-transmitting member 173, and a second light-modulating member 174. The first light-transmitting member 171, the wavelength conversion member 172, and the second light-transmitting member 173 are located in the through-hole 113 of the light guide member 110.

The first light-transmitting member 171 is located between the side surfaces of the light source 132K and the side surfaces of the through-hole 113 of the light guide member 110. It is advantageous to provide the first light-transmitting member 171 because the light from the light source 132K is guided to the light guide member 110 with less reflection.

The wavelength conversion member 172 covers the upper surface of the light source 132K. The wavelength conversion member 172 also covers the upper surface of the first light-transmitting member 171. The wavelength conversion member 172 is a transmissive resin member that includes a color-modulating material that is fluorescent with respect to the light emitted by the light source 132K.

The second light-transmitting member 173 covers the upper surface of the wavelength conversion member 172. The upper surface of the second light-transmitting member 173 can be a flat surface. Alternatively, the upper surface of the second light-transmitting member 173 may be a concave or convex curved surface.

The second light-modulating member 174 is located on the second light-transmitting member 173. The second light-modulating member 174 is partially reflective and partially transmissive to the light emitted by the light source 132K. The second light-modulating member 174 is located at a position overlapping the light source 132K when projected onto the XY plane. The second light-modulating member 174 partially reflects the light emitted directly upward from the light source 132K, and partially transmits the light. Thereby, compared to the luminance of the other regions, the luminance of the region directly above the light source 132K at the first surface 111, which is the light-emitting surface of the cell 130, is less likely to be extremely high, and the uneven luminance of the light of the entire cell 130 can be reduced.

The support member 200 includes an insulating base 150, a wiring layer 151, a first bonding member 141, a light-reflective sheet 142, and a second bonding member 143. The first bonding member 141, the light-reflective sheet 142, and the second bonding member 143 are located in this order on an upper surface of the insulating base 150.

The insulating base 150 is a base for forming the wiring layer 151 thereon. The wiring layer 151 may include two or more layers in the thickness direction of the insulating base 150. The first bonding member 141 is located on the upper surface of the insulating base 150. The wiring layer 151 is located on the lower surface of the insulating base 150. The wiring layer 151 is covered with an insulating film 152. The lower surface of the insulating film 152 corresponds to at least a portion of the lower surface 202 of the support member 200.

In the cell 130, the wiring layer 151 corresponds to the wiring layer 40 of the cell 30 shown in FIG. 4A and FIG. 4B described above. In the cell 130, the electrical connections between the cells 130 and the electrical connections between the terminals are achieved by the interconnects included in the wiring layer 151.

The first bonding member 141 is located between the insulating base 150 and the light-reflective sheet 142, and bonds the insulating base 150 and the light-reflective sheet 142.

The light-reflective sheet 142 is located below the second surface 112 of the light guide member 110 and below the light source 132K. The light-reflective sheet 142 is reflective to the light emitted by the light source 132K. The light-reflective sheet 142 can include, for example, a resin member that includes many bubbles and/or a resin member that includes a light-diffusing agent.

The second bonding member 143 is located between the light-reflective sheet 142 and the second surface 112 of the light guide member 110 and bonds the light-reflective sheet 142 and the light guide member 110. The light source 132K is located on the second bonding member 143 and in the through-hole 113 of the light guide member 110. The second bonding member 143 is transmissive to the light emitted by the light source 132K.

A pair of connection members 161 is located below the light source 132K. Each of the connection members 161 is located in a hole portion that extends through the support member 200 between the upper surface 201 and the lower surface 202, and extends to the wiring layer 151 at the lower surface 202 side of the support member 200. The pair of connection members 161 is provided to correspond to a pair of electrodes 126. The conductive connection member 161 electrically connects the electrodes 126 and the wiring layer 151.

An insulating film 153 is provided at the lower surface of the insulating film 152 to cover the connection member 161. The insulating film 153 covers a space between the pair of connection members 161 to ensure electrical insulation between the pair of connection members 161.

As shown in FIG. 5B, the light source 132K includes a light-emitting element 121, the pair of electrodes 126, and a resin member 122. The configuration of the light-emitting element 121 can be similar to that of the light-emitting element 31 described with reference to FIG. 4B.

The positive and negative electrodes 126 are located at the lower surface of the light-emitting element 121. The positive and negative electrodes 126 are electrically connected to the p-side and n-side electrodes of the light-emitting element 121, respectively.

The resin member 122 covers the upper, side, and bottom surfaces of the light-emitting element 121. As in the example, the resin member 122 can include a first resin portion 123 and a second resin portion 124. The first resin portion 123 covers the upper surface and the side surfaces of the light-emitting element 121. The second resin portion 124 covers the bottom surface of the light-emitting element 121 and the bottom surface of the first resin portion 123.

The first resin portion 123 has functions of protecting the light-emitting element 121 and performing wavelength conversion and light diffusion according to particles added to the first resin portion 123. The second resin portion 124 is a light-reflecting portion that is reflective to the light emitted by the light-emitting element 121.

In the example, a first light-modulating member 128 is provided at the upper surface of the first resin portion 123. The first light-modulating member 128 is partially reflective and partially transmissive to the light emitted by the light-emitting element 121 and/or modulated by the fluorescent material. The first light-modulating member 128 changes the emission direction and/or the amount of the light emitted from the upper surface of the resin member 122.

Thus, in the cell 130 according to the modification, the thickness of the cell 130 can be thin because the light source 132K is located in the through-hole 113 that extends through the light guide member 110. Because the thickness of the cell 130 affects the thickness of the light-emitting module, the storage space of the backlight can be reduced when the light-emitting module is used in a backlight of a liquid crystal display, etc.

The light-emitting module 20 according to the present embodiment can include the cell 30 or the cell 130. Unless otherwise specified hereinbelow, the light-emitting module according to the present embodiment can include either the cell 30 or the cell 130.

Operations of the light-emitting module 20 according to the embodiment and modifications thereof will now be described.

In the light-emitting module 20, the light sources located in the first region 24 and the light sources located in the second region 28 are alternately lit and are not lit simultaneously. The time period in which the light sources located in the first region 24 are lit is taken as a first time period; and the time period in which the light sources located in the second region 28 are lit is taken as a second time period. In the first time period, a voltage that is greater than a voltage applied to the terminal 41b is applied to the terminal 41a; and the light sources in the first region 24 are lit. In the first time period, the light sources in the second region 28 are not lit. In the second time period, a voltage that is less than a voltage applied to the terminal 41b is applied to the terminal 41a; and the light sources in the second region 28 are lit. In the second time period, the light sources in the first region 24 are not lit. In a specific implementation, the first time period and the second time period are consecutive time periods; and these consecutive time periods are cyclically repeated.

When multiple light sources simultaneously emit light, the luminance is increased by amplification of light emitted from adjacent light sources in addition to the self-luminous light. The number of other light sources adjacent to each light source is greater in the first region 24 than that of the light sources in the second region 28. Therefore, when the light sources in the first region 24 and the light sources in the second region 28 are driven by a current of the same current value, the luminance in the first region 24 is greater than that in the second region 28.

Each of the light sources 32f, 32g, 32j, and 32k located in the first region 24 has four adjacent light sources at the periphery. Each of the light sources 32a, 32d, 32n, and 32r in the second region 28 has two adjacent light sources at the periphery. Each of the light sources 32b, 32c, 32e, 32h, 32i, 32m, 32p, and 32q in the second region 28 has three adjacent light sources at the periphery.

If the sixteen light sources 32a to 32r of the light-emitting module 20 emit light simultaneously, the luminance of the first region 24 is greater than the luminance of the second region 28. To address such a technical issue, in the light-emitting module 20 according to the present embodiment, the light sources in the first region 24 and the light sources in the second region 28 are independently driven so that the luminance of the first region 24 is substantially equal to the luminance of the second region 28.

More specifically, the light sources in the first region 24 and the light sources in the second region 28 are driven by the same drive power source. Then, the polarity of the drive power source is switched between the first time period in which the light sources in the first region 24 are driven and the second time period in which the light sources in the second region 28 are driven. Lengths of the first time period and the second time period are adjusted so that the luminance of the first region 24 is substantially equal to the luminance of the second region 28.

The drive power source that drives the light sources may be a power source that outputs a direct current or a power source that outputs an alternating current. When the drive power source outputs a direct current, the direction of the current supplied to the light-emitting module is switched by a switching circuit as described below. When the drive power source outputs an alternating current, the drive power source can be directly connected to the light-emitting module, but it may be necessary to adjust the first and second time periods by a functional element that controls the phase.

An operation of the light-emitting module according to the present embodiment will now be described.

Figure 6:
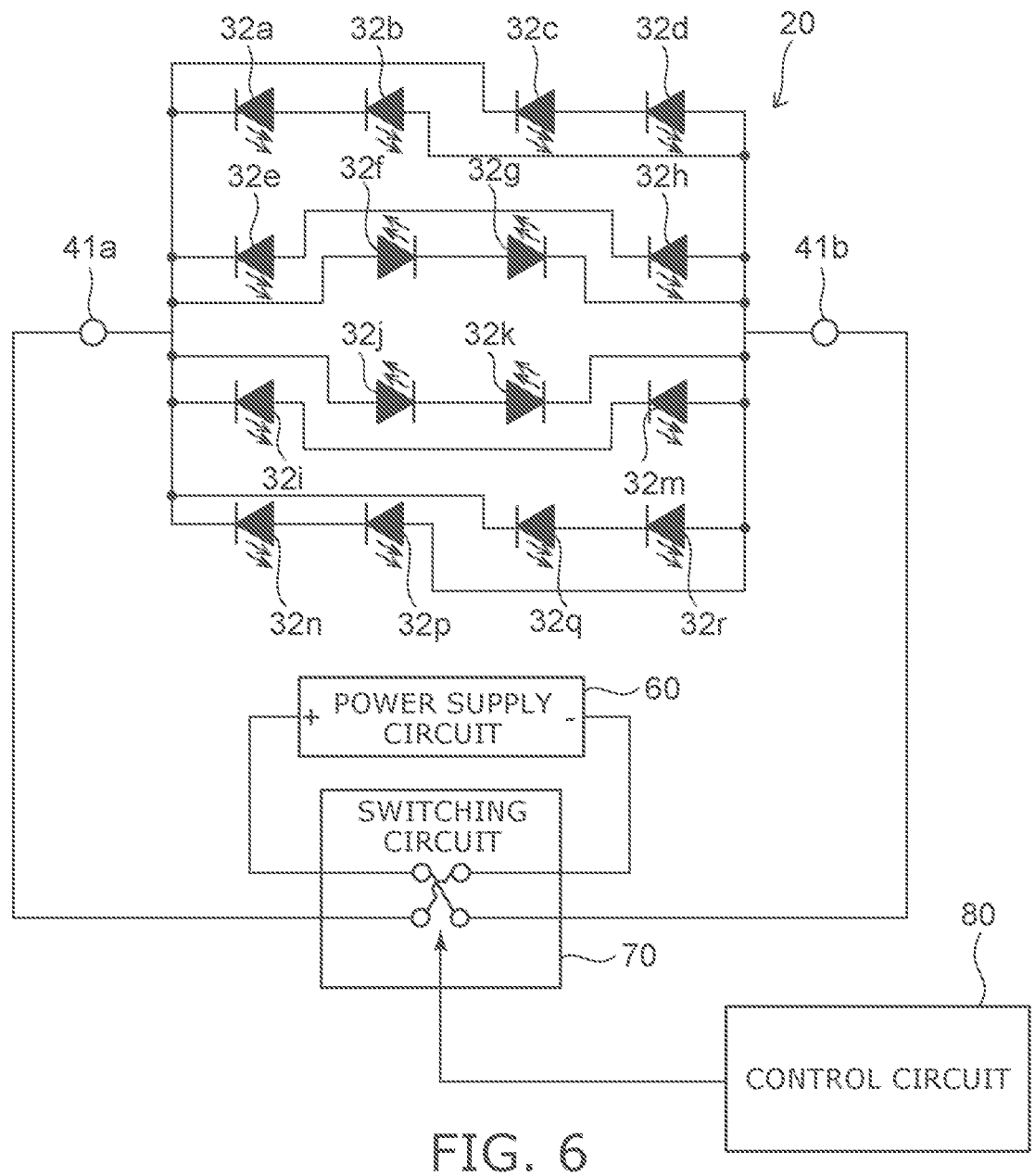
FIG. 6 is a schematic block diagram illustrating an operation of the light-emitting module according to the first embodiment.

FIG. 6 is a schematic block diagram illustrating an operation of the light-emitting module according to the present embodiment.

As shown in FIG. 6, the light-emitting module 20 is connected to a power supply circuit 60 via a switching circuit 70. The power supply circuit 60 is, for example, a constant current circuit. The constant current value of the current output by the power supply circuit 60 is set by a not-illustrated light control circuit. The power supply circuit 60 may be a constant current circuit that sets a constant current value by modifying the amplitude of the current value, or may be a constant current circuit that sets a substantially low current value by supplying a constant current intermittently.

The switching circuit 70 includes a switch. The switch of the switching circuit 70 switches the connection of the positive and negative outputs of the power supply circuit 60 between the terminals 41a and 41b of the light-emitting module 20. Specifically, the negative output terminal of the power supply circuit 60 illustrated as "−" is connected to the terminal 41b when the positive output terminal of the power supply circuit 60 illustrated as "+" is connected to the terminal 41a. The negative output of the power supply circuit 60 is connected to the terminal 41a when the positive output of the power supply circuit 60 is connected to the terminal 41b.

The switching circuit 70 is connected to a control circuit 80 and switches the connection of the switch based on a control signal supplied from the control circuit 80. The control signal that is output by the control circuit 80 is, for example, a binary signal that has a high level and a low level. When the control signal is at the high level, the positive output of the power supply circuit 60 is connected to the terminal 41a; and the negative output of the power supply circuit 60 is connected to the terminal 41b. When the control signal is at the low level, the negative output of the power supply circuit 60 is connected to the terminal 41a; and the positive output of the power supply circuit 60 is connected to the terminal 41b. The time period in which the control signal is at the high level is the first time period; and the time period in which the control signal is at the low level is the second time period.

The control circuit 80 is, for example, a computer device that is operated by a program; and lengths of the first time period and the second time period are set by the program. When light control of the light-emitting module 20 is performed, the first time period and the second time period are set by the program for a current value corresponding to each of the light control setting values. The switching circuit 70 and the control circuit 80 may be portions of other circuits, or the switching circuit 70 and the control circuit 80 may be integrally configured. At least one of the switching circuit 70 and the control circuit 80 may be integrally configured with the power supply circuit 60.

Figure 7A:
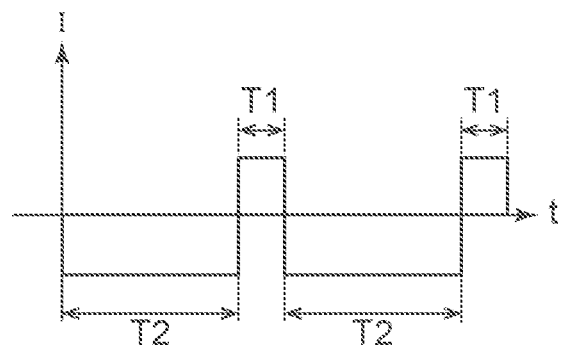
FIG. 7A and FIG. 7B are schematic waveform diagrams for describing an operation of the light-emitting module according to the first embodiment.
Figure 7B:
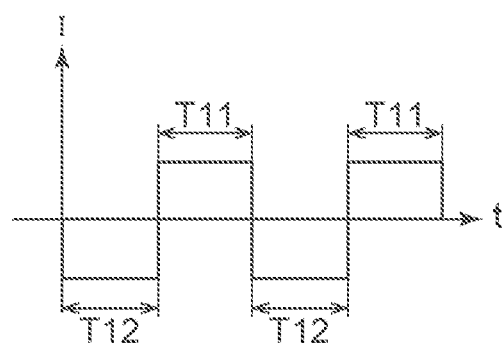

FIG. 7A and FIG. 7B are schematic waveform diagrams for describing the operation of the light-emitting module according to the present embodiment.

FIG. 7A and FIG. 7B show examples of waveforms of currents flowing to light sources in two regions when setting the proportion of the first time period and the second time period for the same light control setting value so that the luminance of the first region 24 is substantially equal to the luminance of the second region 28.

When all of the light sources are caused to emit light of the same luminance with the same current, there is a tendency that the luminance of the first region 24 becomes greater than the luminance of the second region 28. To achieve more uniform luminance, initially, a first time period T1 is set to be less than a second time period T2 as shown in FIG. 7A.

The first time period T1 and the second time period T2 are adjusted to reduce the uneven luminance while checking the luminance of the entire light-emitting module 20. As shown in FIG. 7B, uniform luminance of the entire light-emitting module 20 is achieved by setting a first time period T11 and a second time period T12. In such a case, the first time period T11 and the second time period T12 are set to be substantially equal.

Thus, the uniform luminance of the entire light-emitting surface of the light-emitting module 20 can be achieved by setting the first time period to a value that is substantially equal to the second time period or less than the second time period. The setting ranges of the first and second time periods are appropriately set according to the arrangement and the connections of the light sources. Although the proportion of the first time period and the second time period is adjusted so that T1+T2=T11+T12 is satisfied in the example, the adjustment of the luminance may be achieved by fixing one of the first time period or the second time period and changing the other. Alternatively, the first time period and the second time period may be independently adjusted for each luminance setting according to the current value corresponding to the luminance.

Figure 8A:
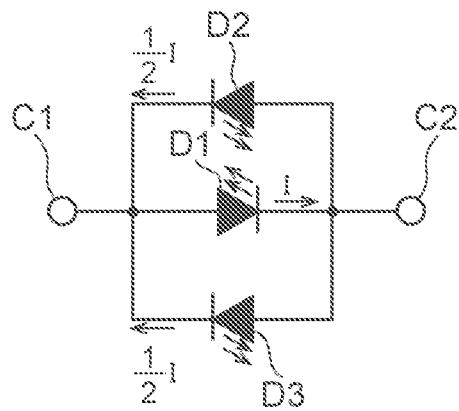
FIG. 8A to FIG. 8C are schematic equivalent circuit diagrams for describing operations of the light-emitting module according to the first embodiment.
Figure 8B:
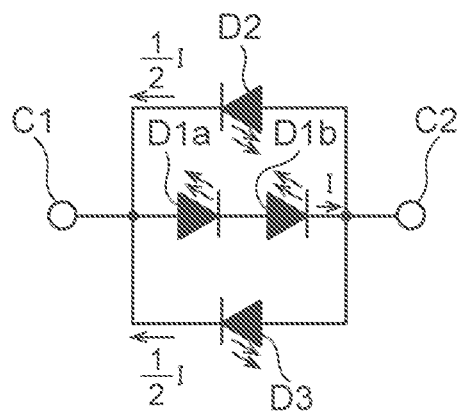
Figure 8C:
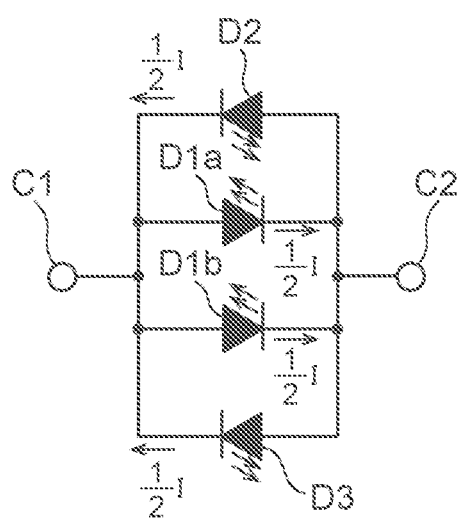

FIG. 8A to FIG. 8C are schematic equivalent circuit diagrams for describing operations of the light-emitting module according to the present embodiment.

The luminance of the light emitted by the light source increases as the current flowing in the light source increases. Also, the luminance of the light emitted by the light-emitting module 20 increases as the number of light sources emitting light increases. That is, the luminance of the light emitted by the light-emitting module 20 is a function of the current flowing in the light sources included in the light-emitting module 20 and the number of light sources simultaneously emitting light. Therefore, it is necessary to set the first and second time periods for each circuit configuration according to the currents flowing in the light sources.

In the example of FIG. 8A, a light source D1 in the first region is located between two light sources D2 and D3 in the second region. The light sources D1 to D3 are connected in parallel between terminals C1 and C2. The light source D1 and the light sources D2 and D3 are connected in anti-parallel.

When the power supply circuit is set to cause a current I to flow between the terminals C1 and C2, the current I flows in the light source D1 in the first time period; and the current of $(½)×I$ flows in each of the two light sources D2 and D3 in the second time period. To achieve uniform luminance, the first time period is set to be equal to the second time period, or to be less than the second time period according to the level of the amplification of the luminances of the two light sources D2 and D3.

In the example of FIG. 8B, two light sources D1a and D1b in the first region are connected in series. The two light sources D2 and D3 in the second region is connected in parallel to the series circuit of the light sources D1a and D1b. The series circuit of the light sources D1a and D1b is connected in anti-parallel to the light sources D2 and D3.

When the power supply circuit is set to cause the current I to flow between the terminals C1 and C2, the current I flows in the two light sources D1a and D1b in the first time period; and a current of $(½)×I$ flows in each of the two light sources D2 and D3 in the second time period.

In the example, the number of light sources emitting light in the first time period and the number of light sources emitting light in the second time period are equal. On the other hand, the current that flows in the light sources D1a and D1b is 2 times the current flowing in the light sources D2 and D3. Accordingly, it is necessary to set the first time period of this example to be shorter than that of FIG. 8A. It may be necessary to set the first time period to be sufficiently less than the second time period according to the level of the amplification of the luminance of the light sources D1a and D1b.

In the example of FIG. 8C, the two light sources D1a and D1b in the first region are connected in parallel. The two light sources D2 and D3 in the second region are connected in parallel, and are connected in anti-parallel with the light sources D1a and D1b.

When the power supply circuit is set to cause the current I to flow between the terminals C1 and C2, a current of $(½)×I$ flows in each of the two light sources D1a and D1b in the first time period; and a current of (½)×/flows in each of the two light sources D2 and D3 in the second time period.

In the example, the number of light sources emitting light in the first time period and the number of light sources emitting light in the second time period are equal. Then, the current value that flows in the light sources emitting light in the first time period is substantially equal to the current value that flows in the light sources emitting light in the second time period. Accordingly, the first time period may be set to be substantially equal to the second time period. However, the first time period and the second time period are adjusted according to the levels of the amplification of the luminance of the light sources D1a and D1b and the amplification of the luminance of the light sources D2 and D3.

Although the luminance of the light-emitting module 20 depends on the luminance or the drive current of each light source and the number of lit light sources described above, the luminance of the light-emitting module 20 also has a relationship with the distance between the adjacent light sources and the spreading of the light, etc. Considering such aspects, in a specific implementation of the light-emitting module 20, the first time period and the second time period are determined so that the light-emitting module 20 has an appropriate luminance.

In this manner, more uniform luminance of the light-emitting surface of the light-emitting module 20 can be achieved.

Effects of the light-emitting module 20 according to the present embodiment will now be described.

In the light-emitting module 20 according to the embodiment, the surface at which the light sources of the light-emitting module 20 are located is discriminated as the first region 24 or the second region 28. The first region 24 is a region in which the light sources are located, such that the number of light sources located at positions more proximate to one light source is greater than in another region. Light sources other than the light sources located in the first region 24 are located in the second region 28. Furthermore, in operation, the length of the first time period in which the light sources in the first region 24 are driven and the length of the second time period in which the light sources in the second region 28 are driven are appropriately adjusted. As a result, more uniform luminance of the light-emitting surface of the light-emitting module 20 can be achieved.

In the light-emitting module 20 according to the embodiment, the light sources in the first region 24 and the light sources in the second region 28 are connected to have reverse polarities between the terminals 41a and 41b. According to such a circuit configuration, independent driving can be performed by switching the polarity of the power source connected to the terminals 41a and 41b without separately providing a terminal for the power supply to the light sources in the first region 24 and a terminal for the power supply to the light sources in the second region 28.

By providing the switching circuit 70 between the light-emitting module 20 and the power supply circuit 60 and switching the connection of the switching circuit 70 using the control circuit 80, the light emission of the light sources in the first region 24 and the light emission of the light sources in the second region 28 can be easily switched.

The switching of the connection by the switching circuit 70 can be easily achieved by the control signal generated by the control circuit 80; and more uniform luminance of the light-emitting surface of the light-emitting module 20 can be easily achieved by appropriately setting the first and second time periods.

In the above embodiment, the relationship between the light source and other light sources at positions more proximate to the light source is a relationship between the light sources included in the cells 30 and 130 adjacent to each other in the X-axis direction or the Y-axis direction. Accordingly, the relationship between the light sources described above may be rephrased as the relationship between the mutually-adjacent cells 30 and 130.

Considering the gradual diffusing and spreading of the light radiated from the cells 30 and 130, the relationship between the adjacent light sources also can be determined according to the overlap of the light-emitting regions of the cells 30 and 130.

According to such considerations, for example, the light-emitting region of the cell 30 including the light source 32f in FIG. 1 may be affected not only by the light-emitting regions of the cells 30 respectively including the light sources 32b, 32e, 32j, and 32g but also by the light-emitting regions of the cells 30 respectively including the light sources 32a, 32c, 32k, and 32i. Accordingly, the light source 32f in the first region 24 may be considered to be adjacent to the light sources 32a, 32b, 32c, 32e, 32g, 32i, 32j, and 32k in the second region 28.

By such a definition as well, according to the above embodiment, the number of light sources adjacent to the light sources in the first region 24 is eight; the number of light sources adjacent to the light sources in the second region 28 is three or five; and the classification between the first region 24 and the second region 28 does not change.

When the configuration of the cells 30 is 2×8, that is, in a light-emitting module in which two rows of four cells 30 in the X-axis direction are provided, the definition of the adjacent number is the latter. When the configuration of the cells 30 is 2×8, the number of light sources adjacent to the light source in the first region is five; and the number of light sources adjacent to the light source in the second region is three. The light sources in the first region are located between two light sources of the adjacent second region.

As described above, the shapes of the cells 30 and 130 may be square, rectangular, or circular when viewed in plan.

Even for a light-emitting module that has a different light distribution design from that described above, from the perspective of uneven luminance of the light-emitting surface of the light-emitting module due to the overlap of the light-emitting regions of the multiple light sources, the above-described concepts of the light-emitting module can apply. In other words, the light sources in the first region are located between two light sources in the second region when viewed in plan; and the positional relationship between the light sources in the first region and the light sources in the second region is such that the light-emitting regions of the light sources in the first region are located at positions that can overlap the light-emitting regions of the two light sources in the second region. In such a case, more uniform luminance of the entire light-emitting surface of the light-emitting module can be achieved by causing the light sources in the first region to be lit in the first time period and by causing the light sources in the second region to be lit in the second time period.

Second Embodiment

A planar light source that has a wider light emission area can be configured by combining multiple light-emitting modules 20 described above.

Figure 9A:
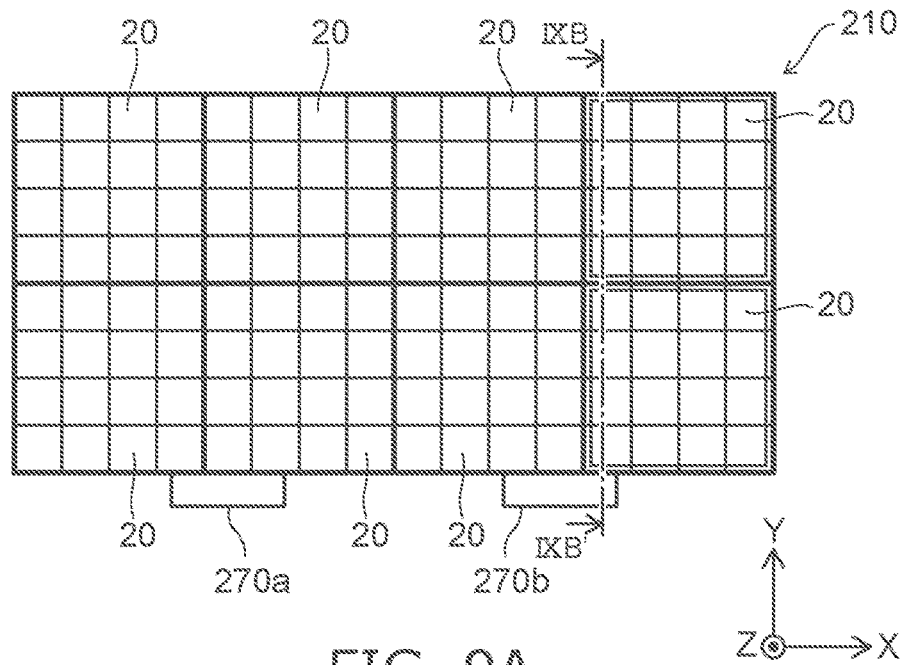
FIG. 9A illustrates a schematic plan view of a planar light source according to a second embodiment.

FIG. 9A illustrates a schematic plan view of a planar light source according to the second embodiment.

In the second embodiment, the planar light source includes one or multiple light-emitting modules 20. In a planar light source 210 shown in FIG. 9A, multiple light-emitting modules 20 are arranged on the XY plane. In the example, four light-emitting modules 20 in the X-axis direction and two light-emitting modules 20 in the Y-axis direction are arranged in two dimensions.

The planar light source 210 includes connectors 270a and 270b. Interconnects connected to the terminals 41a of the light-emitting modules 20 (see FIGS. 1, 2, 3, and 6) are connected to the connector 270a. Interconnects connected to the terminal 41b of the light-emitting module 20 (see FIGS. 1, 2, 3, and 6) are connected to the connector 270b. For example, the power supply circuit 60 (see FIG. 6) is connected to the connectors 270a and 270b via the switching circuit 70 (see FIG. 6) described above.

In the example, eight light-emitting modules 20 are connected in the planar light source 210; and the entire planar light source 210 emits light of the same luminance. Alternatively, one or multiple light-emitting modules 20 may be configured as one set and a plurality of sets may be configured; and the plurality of sets may emit light of partially different luminances, or may individually emit light of the same luminance.

Figure 9B:
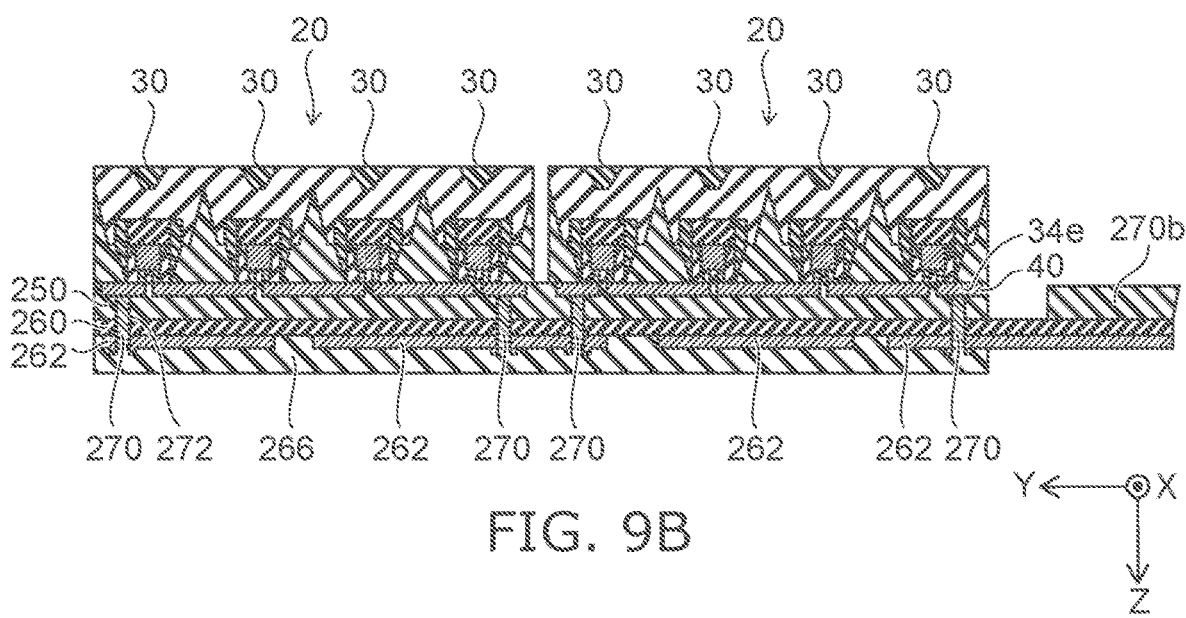
FIG. 9B illustrates a schematic auxiliary cross-sectional view of the planar light source along line IXB-IXB' in FIG. 9A.

FIG. 9B illustrates a schematic auxiliary cross-sectional view of the planar light source 210 along line IXB-IXB' of FIG. 9A.

As shown in FIG. 9B, the multiple light-emitting modules 20 that are included in the planar light source 210 are coupled to a wiring substrate 260 with an insulative bonding member 250 therebetween. The insulative bonding member 250 is, for example, a bonding sheet in which an adhesive is coated onto two surfaces of a resin sheet. The wiring substrate 260 is, for example, a flexible printed circuit board made of an insulative base such as polyimide, etc.

The wiring substrate 260 includes a wiring pattern 262. In the example, the wiring pattern 262 is provided on a surface opposite to the surface on which the bonding member 250 is provided. An insulating layer 266 that covers the wiring pattern 262 is also provided in the wiring substrate 260. With the insulating layer 266, electric insulation between separate regions of the wiring pattern 262 can be ensured. The insulating layer 266 is, for example, a resist, etc.

The connector 270b and the not-illustrated connector 270a are included in the wiring substrate 260; and the planar light source 210 can be electrically connected to an external circuit via the connectors 270a and 270b.

A plurality of vias 270 that extend through the bonding member 250 and the wiring substrate 260 is formed in the bonding member 250 and the wiring substrate 260. Via holes 272 for the vias 270 are formed to reach the wiring layers 40 of the light-emitting modules 20; and each via 270 electrically connects one of the light-emitting modules 20 and the wiring pattern 262 of the wiring substrate 260. Multiple vias 270 are connected respectively to the terminals 41a and 41b formed in the wiring layer 40 of the light-emitting module 20.

For example, the wiring pattern 262 that is formed on the wiring substrate 260 is formed to connect the light-emitting modules 20 in parallel. In another example, to be applicable to local dimming, the wiring pattern 262 is formed to be separately connected for each of multiple sets of the one or multiple light-emitting modules 20.

A planar light source also can be configured using the light-emitting module including the cells 130 according to the modification shown in FIG. 5A by similarly arranging the multiple light-emitting modules and by performing the connections using the wiring layer 151 provided on the insulating base 150. In such a case, the insulating base 150 and the wiring layer 151 correspond to the wiring substrate 260 shown in FIG. 9B.

Effects of the planar light source 210 according to the second embodiment will now be described.

The planar light source 210 according to the second embodiment includes the multiple light-emitting modules 20; and more uniform luminance of the light-emitting surface can be achieved in each light-emitting module 20; therefore, the more uniform luminance can be achieved in a planar light source having a larger surface area.

In the planar light source 210 according to the second embodiment, by appropriately providing the wiring pattern 262 in the wiring substrate 260, the multiple light-emitting modules 20 can be connected to each other at the wiring layer 40 side; and a light source of the necessary surface area can be easily realized.

According to embodiments described above, a light-emitting module and a planar light source with improved uniformity of luminance in the two-dimensional plane can be achieved.

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions. Also, embodiments described above can be implemented in combination with each other.

What is claimed is:

1. A light-emitting module, comprising:
a first terminal;
a second terminal;
a first light source connected between the first terminal and the second terminal;
a second light source and a third light source connected between the first terminal and the second terminal, in anti-parallel with the first light source;
a switching circuit; and
a control circuit to control the switching circuit, causing a first voltage to be applied to the first terminal and a second voltage lower than the first voltage to be applied to the second terminal during a first time period, and causing a third voltage to be applied to the first terminal and a fourth voltage higher than the third voltage to be applied to the second terminal during a second time period prior or subsequent to the first time period,
the first, second, and third light sources being aligned in a first direction along a light-emitting surface, with the first light source between the second light source and the third light source.

2. The light-emitting module according to claim 1, wherein the second time period is equal to or longer than the first time period.

3. The light-emitting module according to claim 1, wherein a first current flowing through the first light source during the first time period is greater than a second current flowing through the second light source during the second time period, and the second time period is longer than the first time period.

4. The light-emitting module according to claim 1, wherein a first current flowing through the first light source during the first time period is equal to a second current flowing through the second light source during the second time period, and the second time period is substantially equal to the first time period.

5. The light-emitting module according to claim 1, wherein the first and second time periods are in each cycle of operation time periods.

6. The light-emitting module according to claim 1, wherein, each of a first current flowing through the first light source during the first time period and a second current flowing through the second light source during the second time period is a direct current.

7. The light-emitting module according to claim 1, wherein the second and third light sources are connected in series between the first terminal and the second terminal.

8. The light-emitting module according to claim 1, wherein the second and third light sources are connected in parallel between the first terminal and the second terminal.

9. A light-emitting module, comprising:
a first terminal;
a second terminal;
a first light source connected between the first terminal and the second terminal; and
a second light source and a third light source connected between the first terminal and the second terminal, in anti-parallel with the first light source,
the first, second, and third light sources being aligned in a first direction along a light-emitting surface, with the first light source between the second light source and the third light source, wherein
the first, second, and third light sources are a part of a matrix of light sources arranged in the first direction and a second direction different from the first direction,
the matrix of light sources includes a first plurality of light sources provided in a first region and a second plurality of light sources provided in a second region surrounding the first region,
the first plurality of light sources include the first light source and are connected such that a current flows form the first terminal to the second terminal, and
the second plurality of light sources include the second and third light sources and are connected such that a current flows form the second terminal to the first terminal.

10. The light-emitting module according to claim 9, wherein a number of light sources in the first region is less than a number of light sources in the second region.

11. The light-emitting module according to claim 10, further comprising:
a switching circuit; and
a control circuit configured to control the switching circuit, causing a first voltage to be applied to the first terminal and a second voltage lower than the first voltage to be applied to the second terminal during a first time period, and causing a third voltage to be applied to the first terminal and a fourth voltage higher than the third voltage to be applied to the second terminal during a second time period prior or subsequent to the first time period.

12. The light-emitting module according to claim 11, wherein a first current flowing through the first light source during the first time period is greater than a second current flowing through the second light source during the second time period, and the second time period is equal to or longer than the first time period.

13. The light-emitting module according to claim 1, further comprising:
a light guide member having a first surface and a second surface opposite to the first surface,
the light guide member having a plurality of recesses in the second surface,
the first, second, and third light sources being disposed in the plurality of recesses, respectively.

14. The light-emitting module according to claim 1, further comprising:
a light guide member having a first surface and a second surface opposite to the first surface,
the light guide member having a plurality of through-holes extending between the first surface and the second surface,
the first, second, and third light sources being disposed in the plurality of through-holes, respectively.

15. The light-emitting module according to claim 1, further comprising:
a first wiring pattern connected to the first light source; and
a second wiring pattern connected to the second light source,
the first wiring pattern including a portion extending from the first light source in the first direction,
the second wiring pattern including a portion extending from the second light source in the first direction,
the portion of the first wiring pattern and the portion of the second wiring pattern being aligned in the first direction.

16. The light-emitting module according to claim 15, wherein
the second wiring pattern is connected to the third light source, and includes another portion extending from the third light source,
said another portion of the second wiring pattern being aligned with the portion of the first wiring pattern in the first direction.

17. A planar light source, comprising:
the light-emitting module according to claim 1; and
a wiring substrate on which the light-emitting module is disposed, the wiring substrate including a wiring pattern electrically connected to the first and second terminals.

18. A planar light source, comprising:
a wiring substrate including a first connector and a second connector; and
a matrix of light-emitting modules disposed on the wiring substrate, each of the light-emitting modules comprising:
a first terminal electrically connected to the first connector;
a second terminal electrically connected to the second connector;
a first light source connected between the first terminal and the second terminal; and
a second light source and a third light source connected between the first terminal and the second terminal, in anti-parallel with the first light source,
the first, second, third light sources being aligned in a first direction along a light-emitting surface, with the first light source between the second light source and the third light source.

19. The planar light source according to claim 18, wherein
the matrix of light-emitting modules are arranged in the first direction and a second direction different from the first direction, and
in each of the light-emitting modules, the first, second, and third light sources are a part of a matrix of light sources arranged in the first direction and the second direction.

20. A planar light source, comprising:
the light-emitting module according to claim 9; and
a wiring substrate on which the light-emitting module is disposed, the wiring substrate including a wiring pattern electrically connected to the first and second terminals.

* * * * *